US 6,529,374 B2

(12) United States Patent
Yamashita et al.

(10) Patent No.: US 6,529,374 B2
(45) Date of Patent: Mar. 4, 2003

(54) ELECTRONIC APPARATUS

(75) Inventors: Norio Yamashita, Tokorozawa (JP); Makoto Tani, Tokyo (JP); Frank J. McNeal, Rowland Heights, CA (US); Douglas R. Philips, La Verne, CA (US); Ron Holder, La Guna Niguel, CA (US)

(73) Assignee: Teac Corporation, Tokyo (JP)

( * ) Notice: Subject to any disclaimer, the term of this patent is extended or adjusted under 35 U.S.C. 154(b) by 14 days.

(21) Appl. No.: 09/794,897

(22) Filed: Feb. 26, 2001

(65) Prior Publication Data

US 2002/0118509 A1 Aug. 29, 2002

(51) Int. Cl.[7] .................................................. H05K 7/20
(52) U.S. Cl. ........................ 361/687; 361/695; 361/719; 165/80.3; 312/223.1
(58) Field of Search .................................. 361/687, 695, 361/697, 719; 165/80.3; 454/184; 257/722; 312/223.1

(56) References Cited

U.S. PATENT DOCUMENTS

| | | | | |
|---|---|---|---|---|
| 5,218,514 A | * | 6/1993 | Huynh et al. ................ 361/683 |
| 5,485,350 A | * | 1/1996 | Hecht et al. ................. 361/692 |
| RE35,915 E | * | 10/1998 | Hastings et al. ............. 439/377 |
| 6,005,770 A | * | 12/1999 | Schmitt ....................... 361/695 |
| 6,058,011 A | * | 5/2000 | Hardt et al. ................. 361/694 |
| 6,064,571 A | * | 5/2000 | Noble ......................... 361/695 |
| 6,123,373 A | | 9/2000 | Yoshida |
| 6,215,659 B1 | * | 4/2001 | Chen .......................... 361/695 |
| 6,330,153 B1 | * | 12/2001 | Ketonen et al. ............. 361/690 |
| D454,854 S | * | 3/2002 | Yamashita et al. ......... D14/167 |

* cited by examiner

Primary Examiner—Darren Schuberg
Assistant Examiner—Hung Van Duong
(74) Attorney, Agent, or Firm—Anderson Kill & Olick; Eugene Lieberstein; Michael N. Meller

(57) ABSTRACT

An electronic apparatus of the present invention has an electric fan in a casing. This electric fan generates air current between circuit substrates. The air current passes through the left-side gaps between the circuit substrates, and reaches the backside face of the electronic apparatus. The air current then passes through a power source substrate attached to a backside panel, and moves to the right. The air current then moves along the right-side inner surface and returns to the front side. The returned air is guided by a plurality of inner fins and then supplied to the electric fan. The heat generated in the casing is cooled by the air current circulating in the casing, and then conducted to the entire inner wall of the casing. The heat of the casing is then released into the atmospheric air through radiation fins arranged on the front face of the casing, the left and right side faces of the casing, and the front face of an open-close cover.

9 Claims, 20 Drawing Sheets

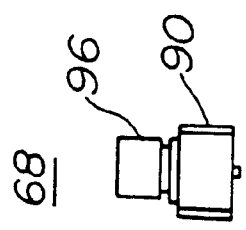
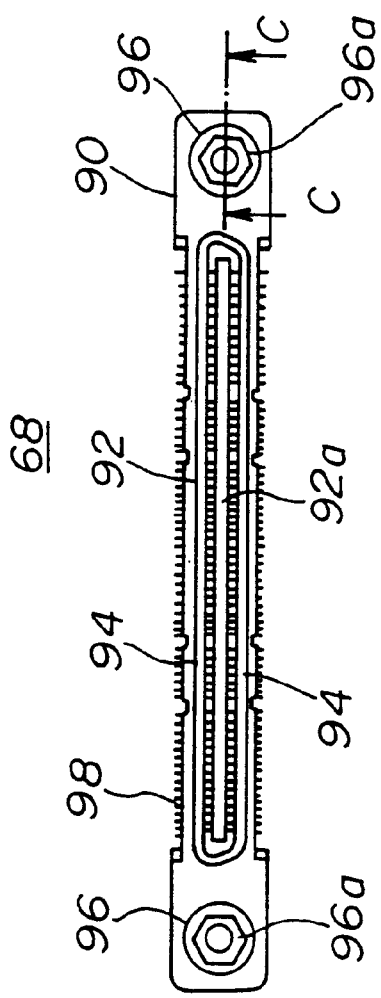
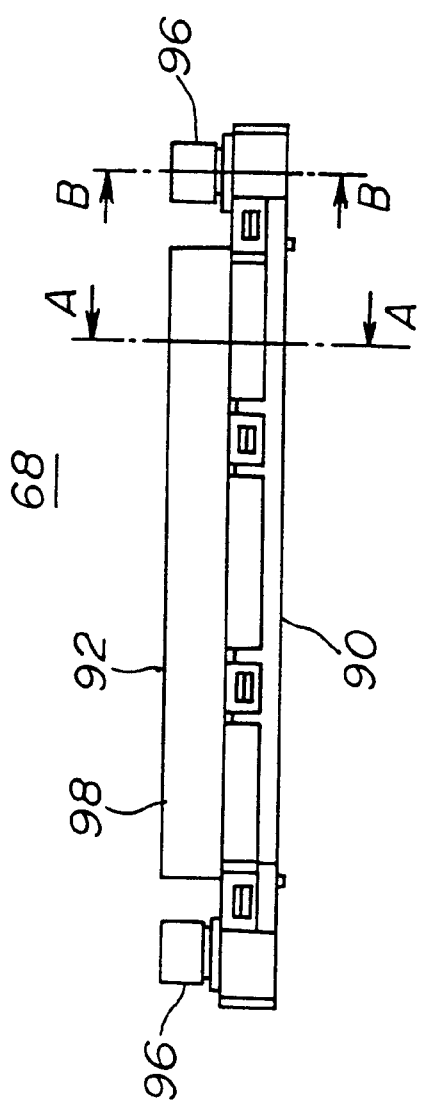

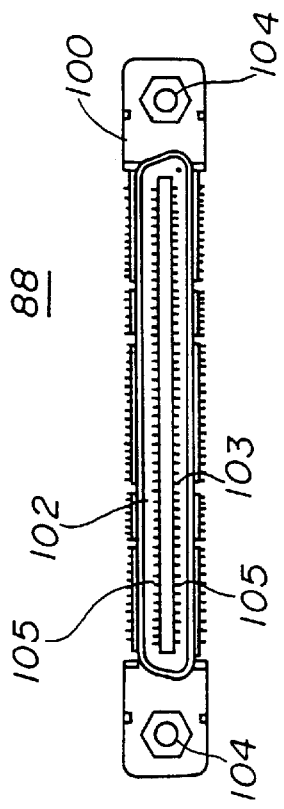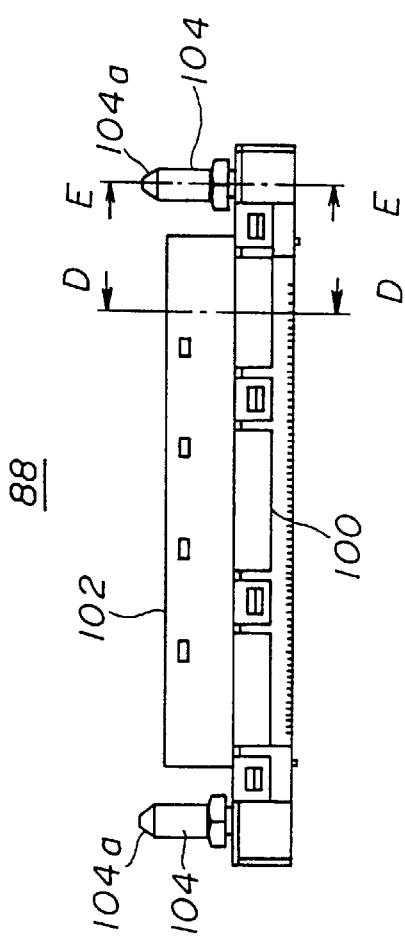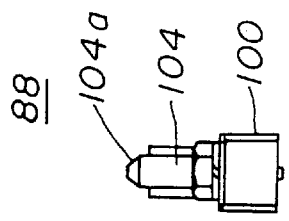

ELECTRONIC APPARATUS

BACKGROUND OF THE INVENTION

1. Field of the Invention

The present invention relates to an electronic apparatus having a structure in which a substrate provided with electronic parts is accommodated in a hermetically sealed casing.

2. Description of the Related Art

A memory device that is used as an AVTR (Airborne Video Tape Recorder) aboard an airplane, for instance, can be replaceably equipped with a recording medium cartridge inside a box-like casing that is hermetically sealed so as to cope with fluctuations of atmospheric pressure with altitude, and prevent adverse influence from humidity, dust, fungus, and other environmental factors. In recent years, recording media of this type are shifting from video tape to memory cards that contain semiconductor memories, such as PCMA-CIA (Personal Computer Memory Card International Association) cards. One or a plurality (2 to 7) of memory cards can be accommodated in one cartridge, depending on the required memory size.

In the above memory device into which a memory cartridge is replaceably inserted, a substrate equipped with an electronic part such as a CPU is also accommodated in the casing. An electronic part such as a CPU has a large quantity of heat generation, and therefore needs to be cooled down.

Methods for cooling a substrate accommodated in a hermetically sealed casing include: 1) a method of stirring the air in the casing; 2) a method of attaching an electronic part such as a CPU directly to the inner wall of the casing; 3) a method of conducting heat to the casing by connecting the heat generating portion to the casing by a heat pipe; and 4) a method of cooling the heat generating portion by employing a Peltier element or a heat exchanger.

However, by the method 1) of stirring the air inside the casing, external air cannot be introduced into the hermetically sealed casing, and the inner air cannot be released from the casing. Because of this, it is difficult to cool down even by employing a fan for stirring the air. Furthermore, with an electronic part such as a CPU having a large heat value, there is a problem that the mean temperature is below the allowable temperature range even after the stirring of the air inside the casing.

As for the method 2), it is not realistic to attach an electronic part such as a CPU directly to the inner wall of the casing.

As for the methods 3) and 4), the production costs are high, because a heat pipe, a Peltier element, and a heat exchanger are expensive. Also, since those components are relatively large in size, it is difficult to secure a wide enough space, allowing less freedom in design.

The memory cartridge is provided with a multipolar male connector at the end portion of the insertion side. By inserting the memory cartridge, the multipolar male connector is connected to a multipolar female connector located on the substrate in the memory device. When the cartridge is replaced by a new one, the cartridge is guided and inserted through a cartridge inlet, and the multipolar female connector located in the memory device is engaged with and electrically connected to the multipolar male connector.

In this cartridge inserting operation, the cartridge is first manually inserted into the cartridge inlet, and then pushed further into the device by the closing of an open-close cover of the cartridge inlet, thereby engaging the multipolar male connector with the multipolar female connector.

In the above device, however, the cartridge is pushed in the inserting direction by closing the cover after the insertion of the cartridge, so that the multipolar male connector is engaged with the multipolar female connector. In this manner, fine adjustment cannot be made to the insertion position, compared with a case of manually handling the cartridge. As a result, the multipolar male connector might deviate from the multipolar female connector.

Since the engagement between the multipolar male connector and the multipolar female connector is made deep inside the cartridge inlet, an operator cannot check whether or not the engagement is successful. Therefore, it is necessary for an operator to close tightly the cover of the cartridge inlet so as to engage the multipolar male connector to the multipolar female connector. However, if the multipolar male connector is brought into contact with the multipolar female connector in a deviated state, either or both of the connectors might be deformed.

SUMMARY OF THE INVENTION

A general object of the present invention is to provide electronic apparatuses in which the above disadvantages are eliminated.

A more specific object of the present invention is to provide an electronic apparatus in which a temperature rise in a hermetically sealed casing is restricted so as to obtain high reliability.

An electronic apparatus in accordance with the present invention includes: a fan that is located inside a casing and generates air current passing through circuit substrates; an air current guide unit that is located on the inner wall of the casing and extends in the direction of guiding the air current toward the suction side of the fan; and a plurality of radiation fins that are located outside the casing. With this electronic apparatus, the air current can be generated in the casing so as to average the inner temperature of the casing, without a costly component such as a heat pipe, a Peltier element, or a heat exchanger. In this manner, the heat generated in the casing can be dispersed all over the casing, and the dispersed heat is then released to the outside through the radiation fins. Thus, the inner temperature of the casing can be cooled down below the allowable temperature range.

Further, a wall of the casing facing the attachment position of the fan is inclined in the flowing direction of the air current. The protruding heights of the radiation fins vary in accordance with the inclination angle of the wall, so that the top ends of the radiation fins formed on the outer surface of the inclined wall are aligned in line. In this structure, a wide enough space can be ensured for attaching the fan in the casing, and the outer surface area of the casing can be prevented from becoming large.

Also, according to the present invention, one of a first connecting terminal and a second connecting terminal is movably set in a direction perpendicular to an insertion direction. During the process of connecting the first connecting terminal to the second connecting terminal, the first and second connecting terminals can be positioned relatively with each other. In this structure, even if the first connecting terminal is inserted at a location slightly deviated from the second connecting terminal, the connection between the first and second connecting terminals can be established.

Further, according to the present invention, one of the first connecting terminal and the second connecting terminal has tapered guide pins that extend in the insertion direction, while the other one has positioning guide holes to be engaged with the guide pins. Through the engaging process between the guide pins and the guide holes, the first and second connecting terminals are positioned relatively with each other. Thus, the first connecting terminal can be connected without fail to the second connecting terminal.

The above and other objects and features of the present invention will become more apparent from the following description taken in conjunction with the accompanying drawings.

BRIEF DESCRIPTION OF THE DRAWINGS

FIG. 15A is a plan view of the multipolar female connector;

FIG. 15B is a front view of the multipolar female connector;

FIG. 15C is a side view of the multipolar female connector;

FIG. 17A is a plan view of a multipolar male connector in the electronic apparatus of the present invention;

FIG. 17B is a front view of the multipolar male connector;

FIG. 17C is a side view of the multipolar male connector;

DESCRIPTION OF THE PREFERRED EMBODIMENTS

The following is a description of embodiments of the present invention, with reference to the accompanying drawings.

Figure 1:
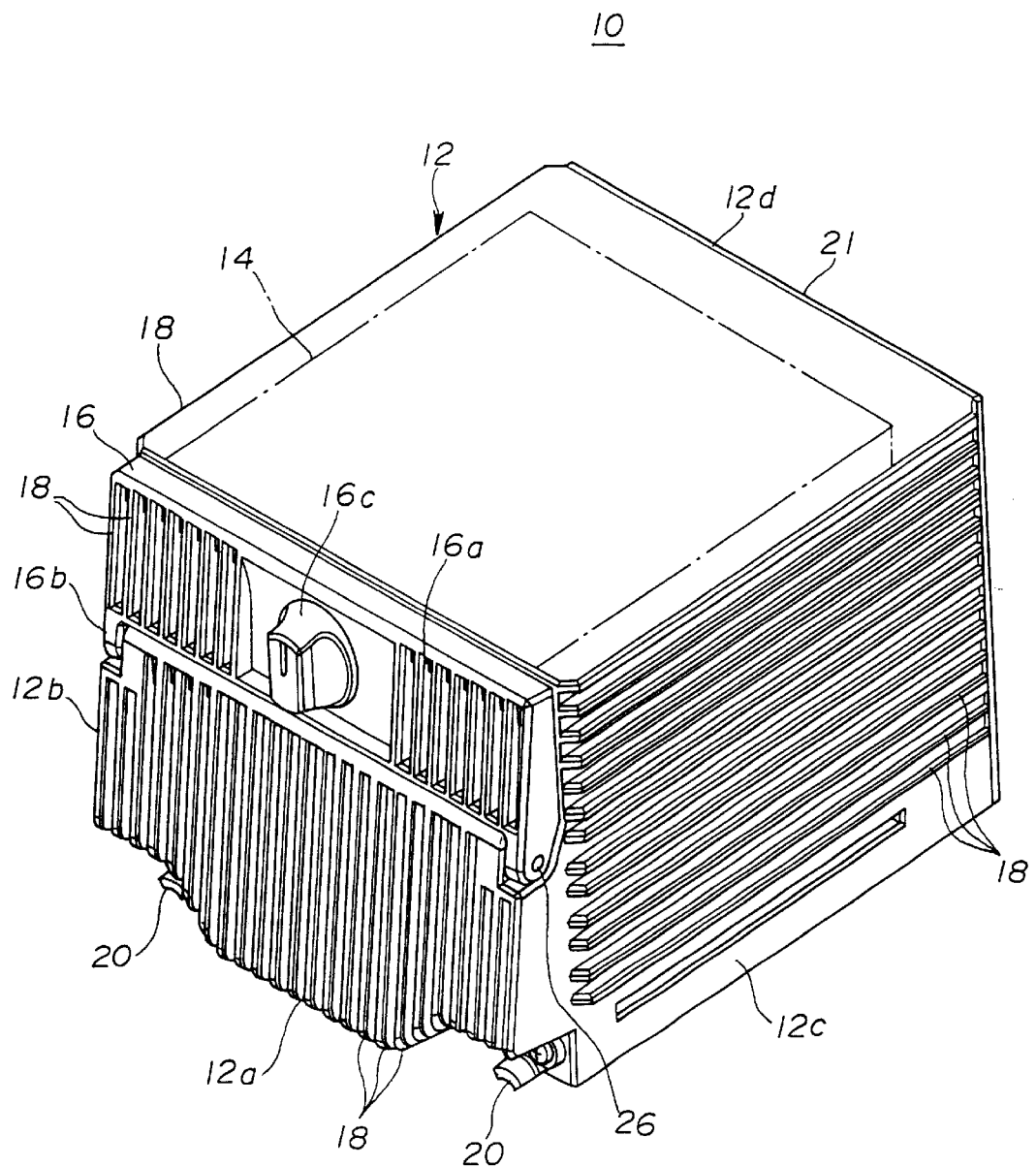
FIG. 1 is a perspective view of an electronic apparatus which is one embodiment of the present invention.
Figure 2:
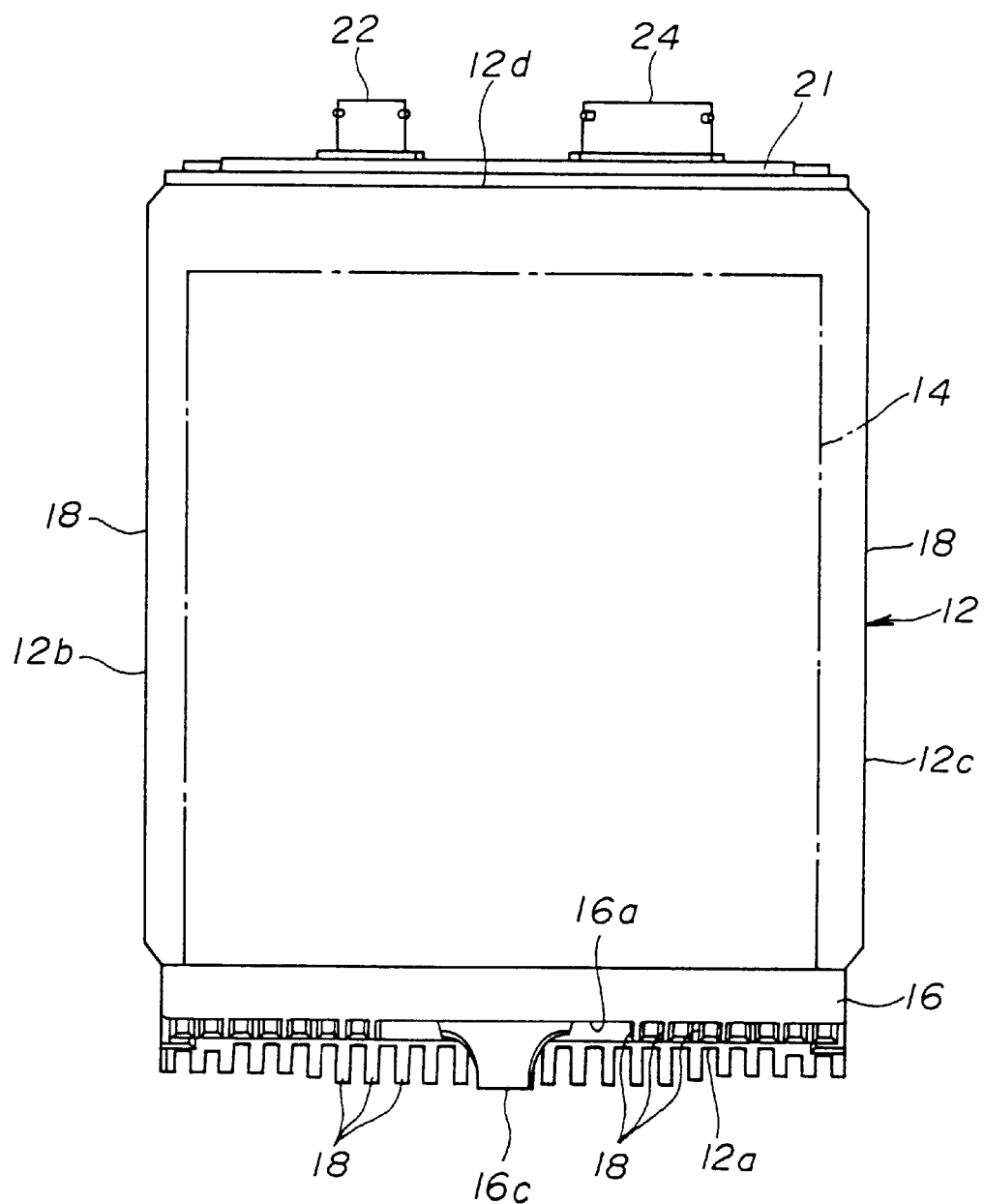
FIG. 2 is a perspective view of the electronic apparatus of the present invention, showing its top face.
Figure 3:
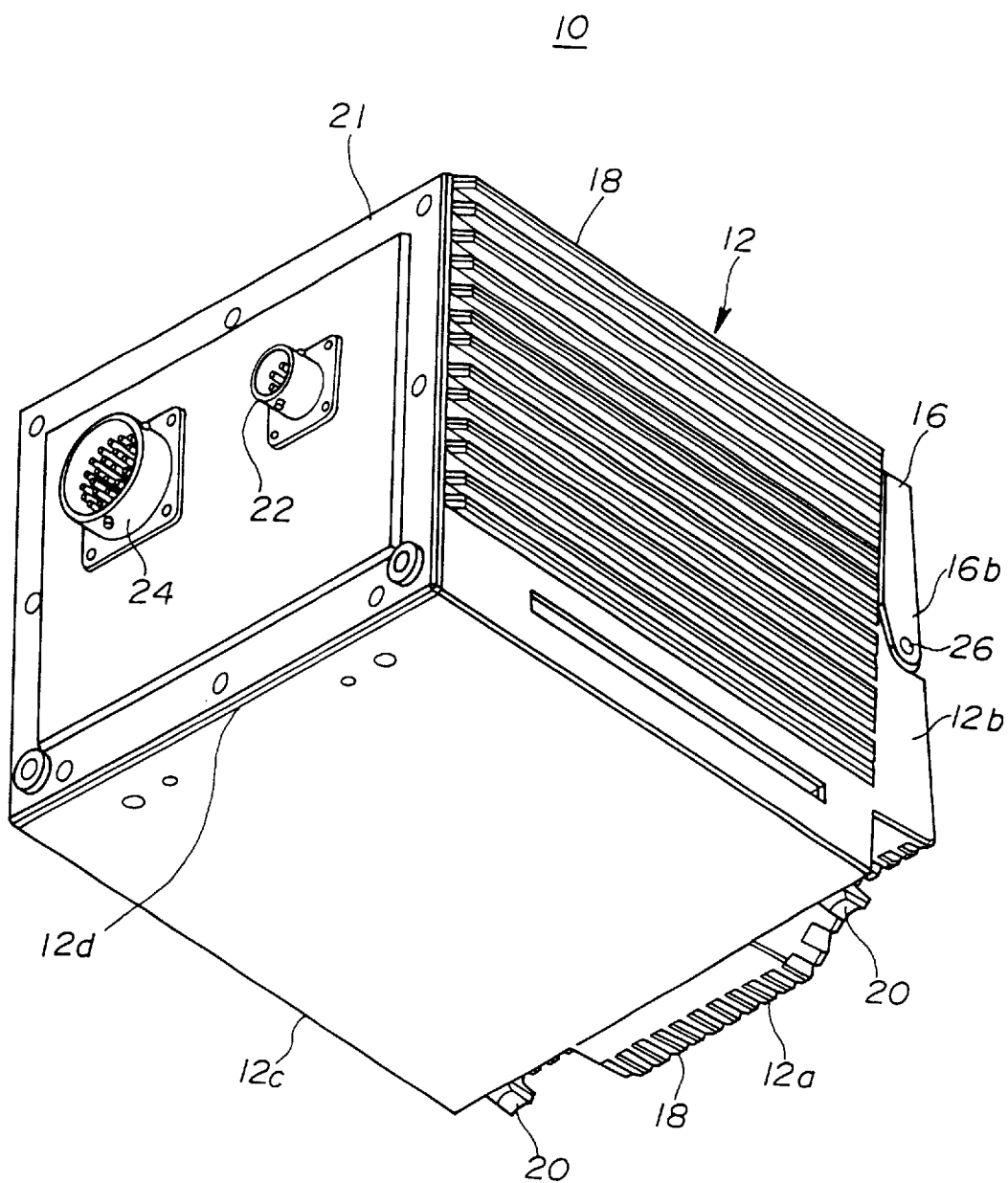
FIG. 3 is a perspective view of the electronic apparatus of the present invention, showing its back face, bottom face, and left side face.

FIG. 1 is a perspective view of an electronic apparatus which is one embodiment of the present invention. FIG. 2 is a perspective view of the electronic apparatus of the present invention, showing its top face. FIG. 3 is a perspective view of the electronic apparatus of the present invention, showing its back face, bottom face, and left side face.

As shown in FIGS. 1 to 3, an electronic apparatus 10 of the present invention is a memory device that is aboard an airplane and stores data such as image data obtained during a flight. This electronic apparatus 10 includes a cartridge mounting unit 14 in which a memory cartridge (not shown) is replaceably mounted in a hermetically sealed box-like casing 12. This casing 12 has a front face 12a provided with an open-close cover 16 that can be rotated in the vertical direction so as to open and close the cartridge mounting unit 14.

The casing 12 is hermetically sealed so as not to be adversely affected by variations in atmospheric pressure, and has a number of radiating fins 18 formed on the front face 12a and the right and left side faces 12b and 12c so as to achieve higher radiation effects.

Further, to secure the electronic apparatus 10, a pair of brackets 20 are screwed to an area near the bottom of the front face 12a. Also, a backside panel 21 is fixed to the back face 12d of the casing 12, thereby sealing the backside opening. The backside panel 21 is provided with a round connector 22 to be connected to a power cable (not shown) and another round connector 24 to be connected to a cable (not shown) for transferring image signals transmitted from an image sensor (not shown).

The open-close cover 16 comprises a front face 16a that opens and closes the cartridge mounting unit 14, a pair of arms 16b that extend from the left and right ends of the front face 16a, and a lock release knob 16c located in the center of the front face 16a. The top ends of the arms 16b of the open-close cover 16 are rotatively supported by an axis 26 protruding from the left and right side faces of the casing 12. When the lock release knob 16c is pushed in the axis direction and then rotated by 90 degrees, a lock unit (not shown) located in the casing 12 is released, thereby allowing open and close movements.

Figure 4:
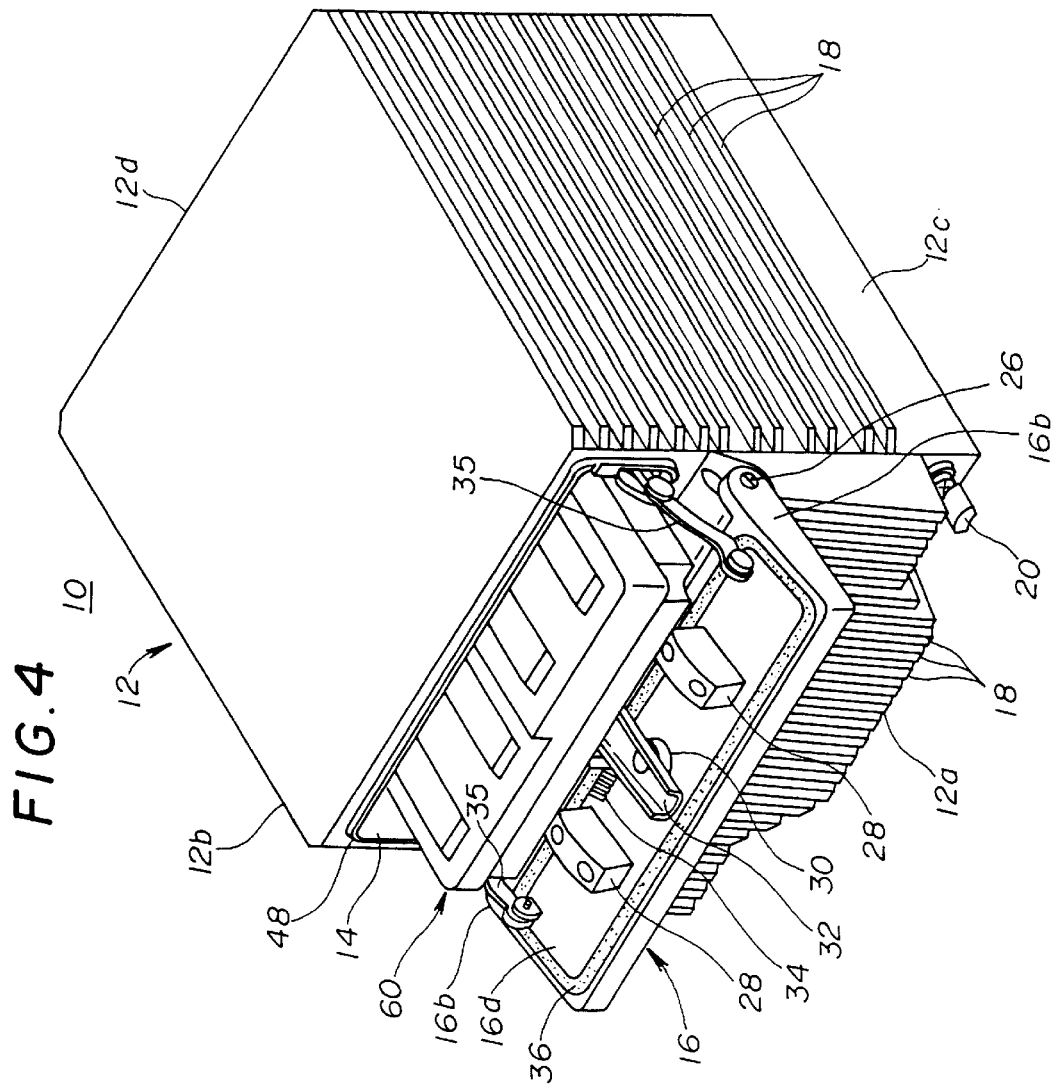
FIG. 4 is a perspective view of a structure in which an open-close cover is opened so as to insert a memory cartridge in the electronic apparatus of the present invention.

FIG. 4 is a perspective view of a structure in which the open-close cover is opened and a memory cartridge 60 is inserted.

As shown in FIG. 4, the back face 16d of the open-close cover 16 is provided with a pair of cartridge contact portions 28, an axis 30 linked to the lock release knob 16c, a lock plate 32 that is secured to an end portion of the axis 30 and locked to the side of the casing 12, and a torsion spring for restoring the axis 30. The back face 16d of the open-close cover 16 is also engaged with a sealing member 36 (shaded in FIG. 4) that seals the front face opening of the casing 12 so as to maintain the airtightness in the casing 12 when the cover 16 is closed.

Link members 35 are located at the left and right ends on the back face 16d of the open-close cover 16. The link members 35 restrict the fully open position of the open-close cover 16 to an angle of 90 degrees. When the open-close cover 16 is rotatively moved through an angle of 90 degrees, the insertion inlet of the cartridge mounting unit 14 is fully opened, so that the memory cartridge 60 can be easily inserted. During the process of rotating from the fully closed position to the fully opened position, slidable members (not shown) connected to the end portions of the link members are slidably moved, so that the memory cartridge 60 inserted in the cartridge mounting unit 14 can be pulled out by a predetermined distance in the ejecting direction.

Figure 5:
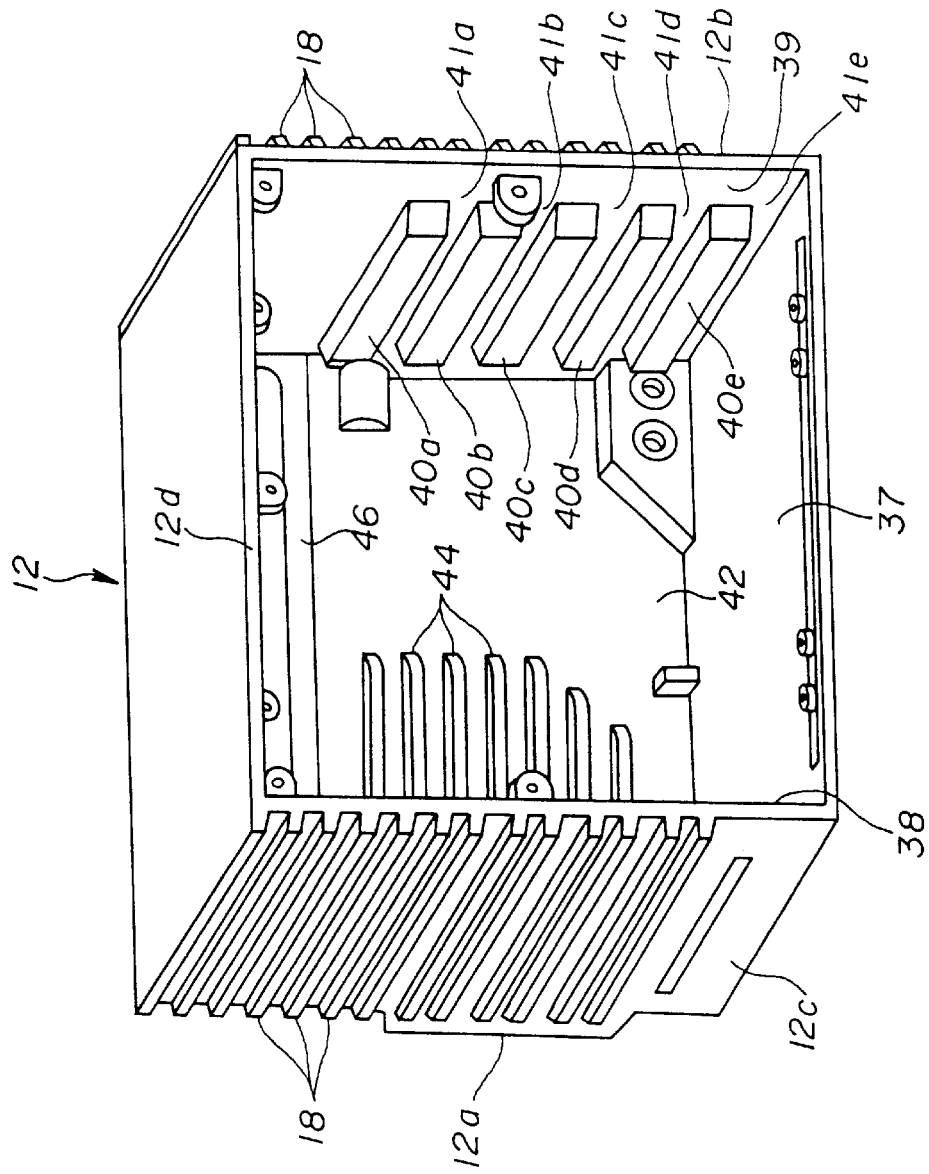
FIG. 5 is a perspective view of the inner structure of the casing of the electronic apparatus of the present invention, seen from the back.

FIG. 5 is a perspective view of the inside of the casing 12 seen from the back.

As shown in FIG. 5, a rectangular-parallelepiped space 37 is formed in the casing 12, and a plurality of substrate attachment members 40a to 40e that extend in the depth direction protrude at predetermined intervals from the left and right inner walls 38 and 39 surrounding the space 37. Between the substrate attachment members 40a to 40e, the substrate insertion concave portions 41a to 41e are formed.

Further, on a front inner wall 42 in the casing 12, a plurality of inner fins (air current guide members) 44 for guiding the inner air current are formed in the transverse direction. The inner fins 44 add extra area to the inner area of the front inner wall 42, so that heat generated internally can be easily transmitted to the casing 12.

A holder attachment member 46 to which a memory cartridge holder 48 is to be attached is located in the upper portion of the space 37, and a plurality of holder fixing portions (not shown) protrude from the holder attachment member 46.

Figure 6:
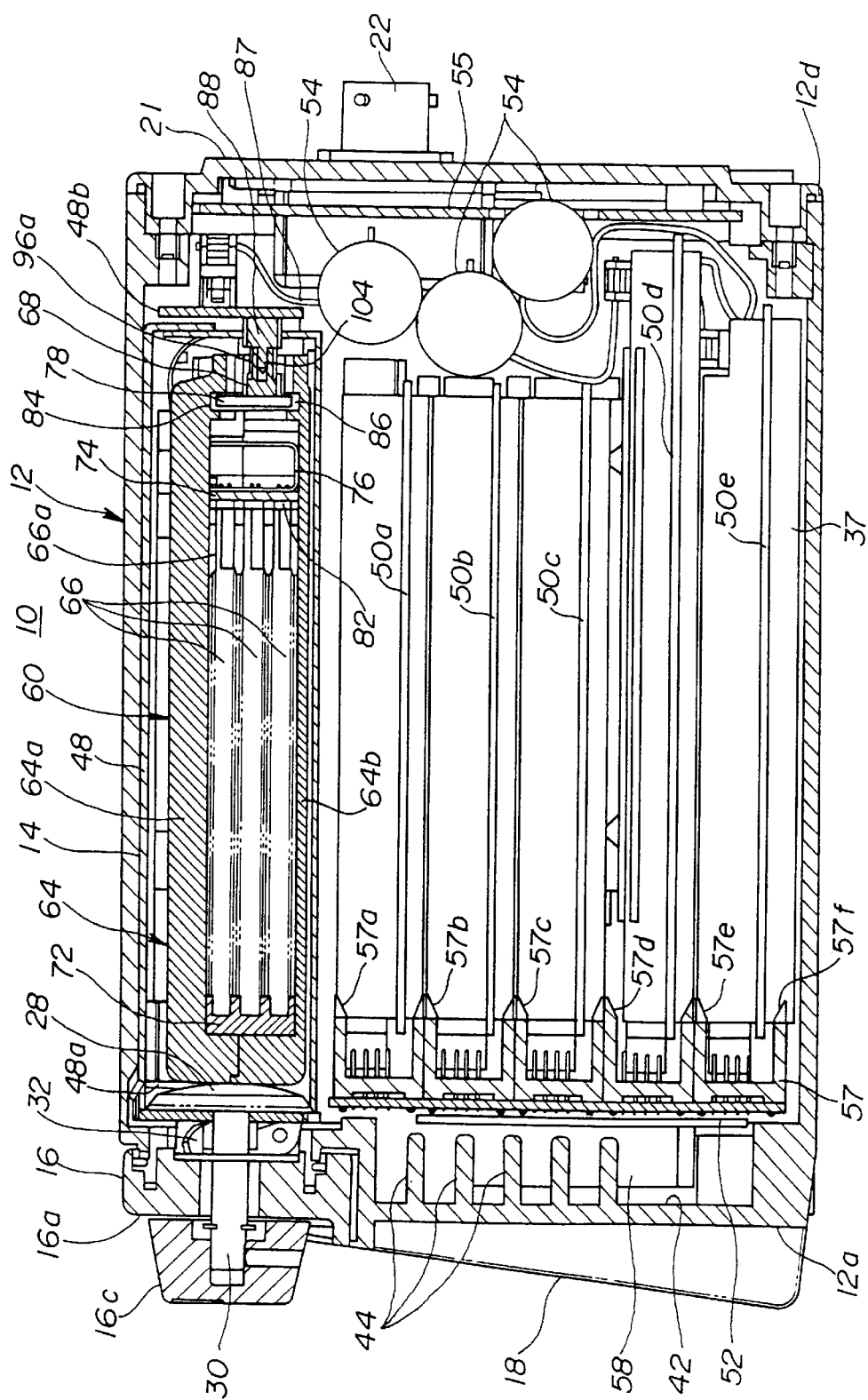
FIG. 6 is a longitudinal section of the inner structure of the electronic apparatus of the present invention, seen from the right side.
Figure 7:
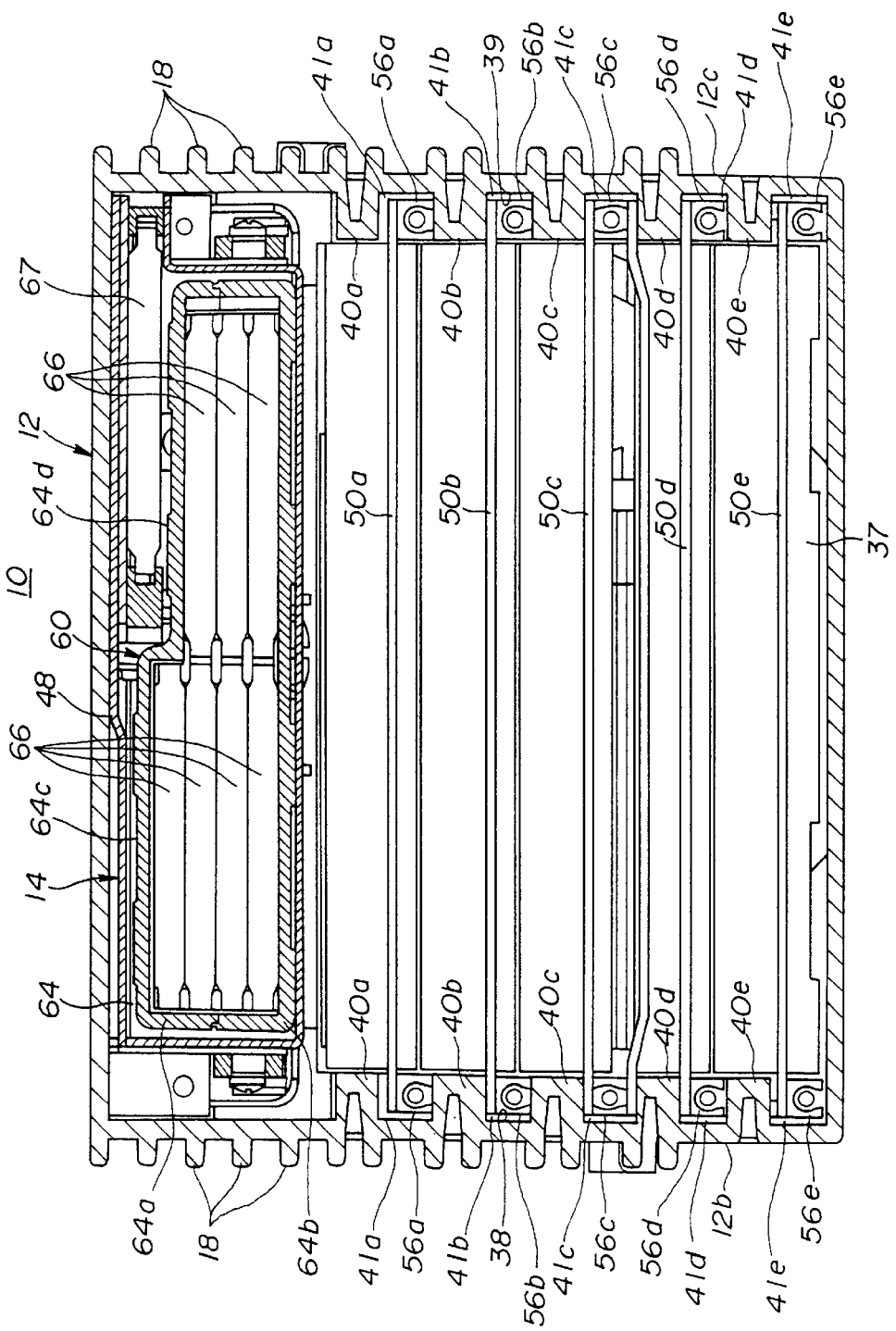
FIG. 7 is a longitudinal section of the inner structure of the electronic apparatus of the present invention, seen from the back.
Figure 8:
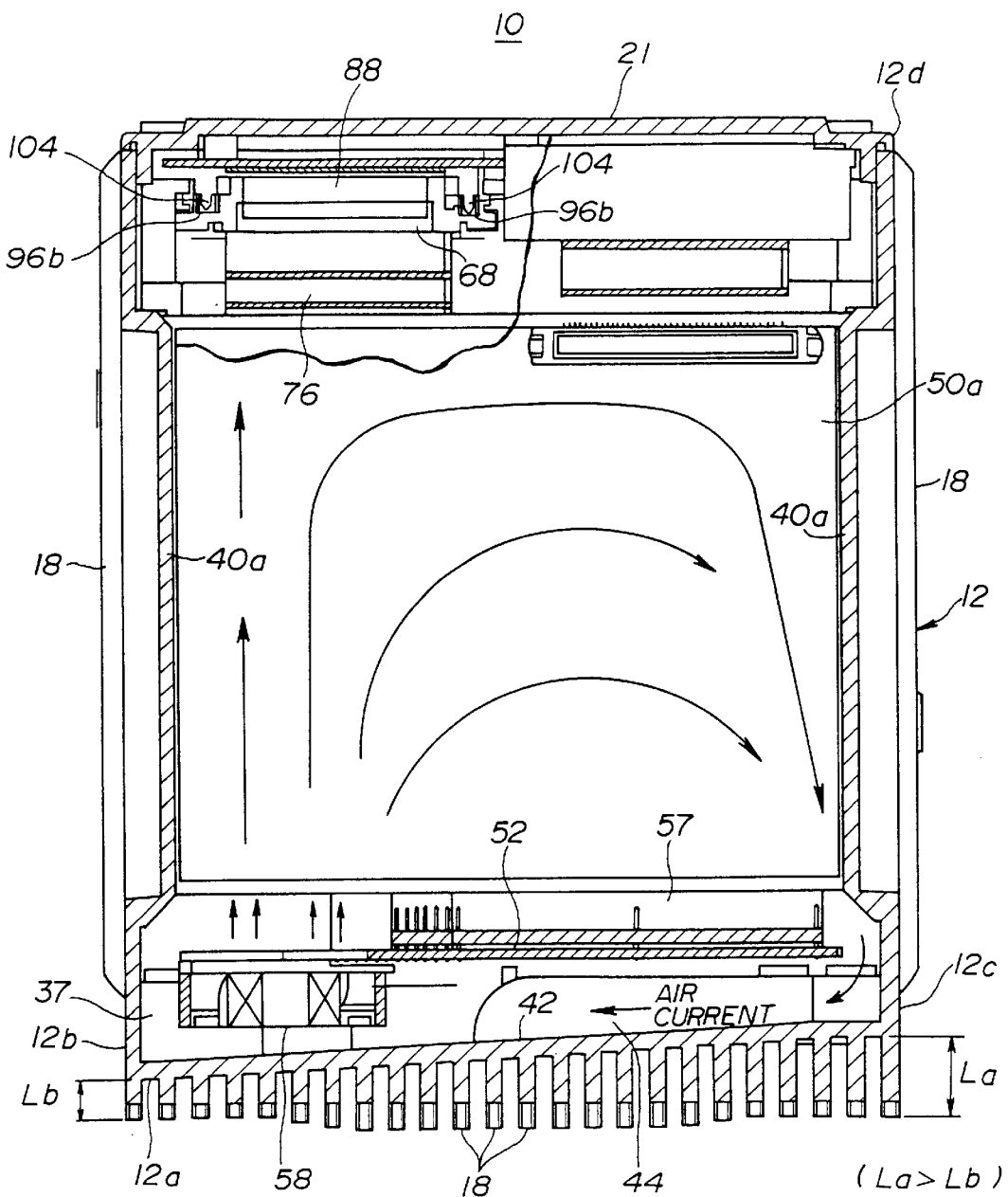
FIG. 8 is a transverse section of the inner structure of the electronic apparatus of the present invention, seen from the above.

FIG. 6 is a longitudinal section of the inner structure of the electronic apparatus 10 seen from one side. FIG. 7 is a longitudinal section of the inner structure of the electronic apparatus 10 seen from the front. FIG. 8 is a transverse section of the inner structure of the electronic apparatus 10 seen from the above.

As shown in FIGS. 6 to 8, the space 37 of the casing 12 accommodates the memory cartridge holder 48 mounted to the upper portion of the space 37, a plurality of circuit substrates 50a to 50e inserted below the memory cartridge holder 48, a front face substrate 52 vertically located on the front face side of the circuit substrates 50a to 50e, and a power substrate 55 provided with a condenser 54 that is located between the front face substrate 52 and the circuit substrates 50a to 50e, and constitutes a backup power circuit.

The circuit substrates 50a to 50e are equipped with a number of heat-generating electronic parts, such as a CPU, and the left and right end portions of the circuit substrates 50a to 50e are held by the substrate insertion concave portions 41a to 41e via substrate support members 56a to 56e, respectively.

Figure 9:
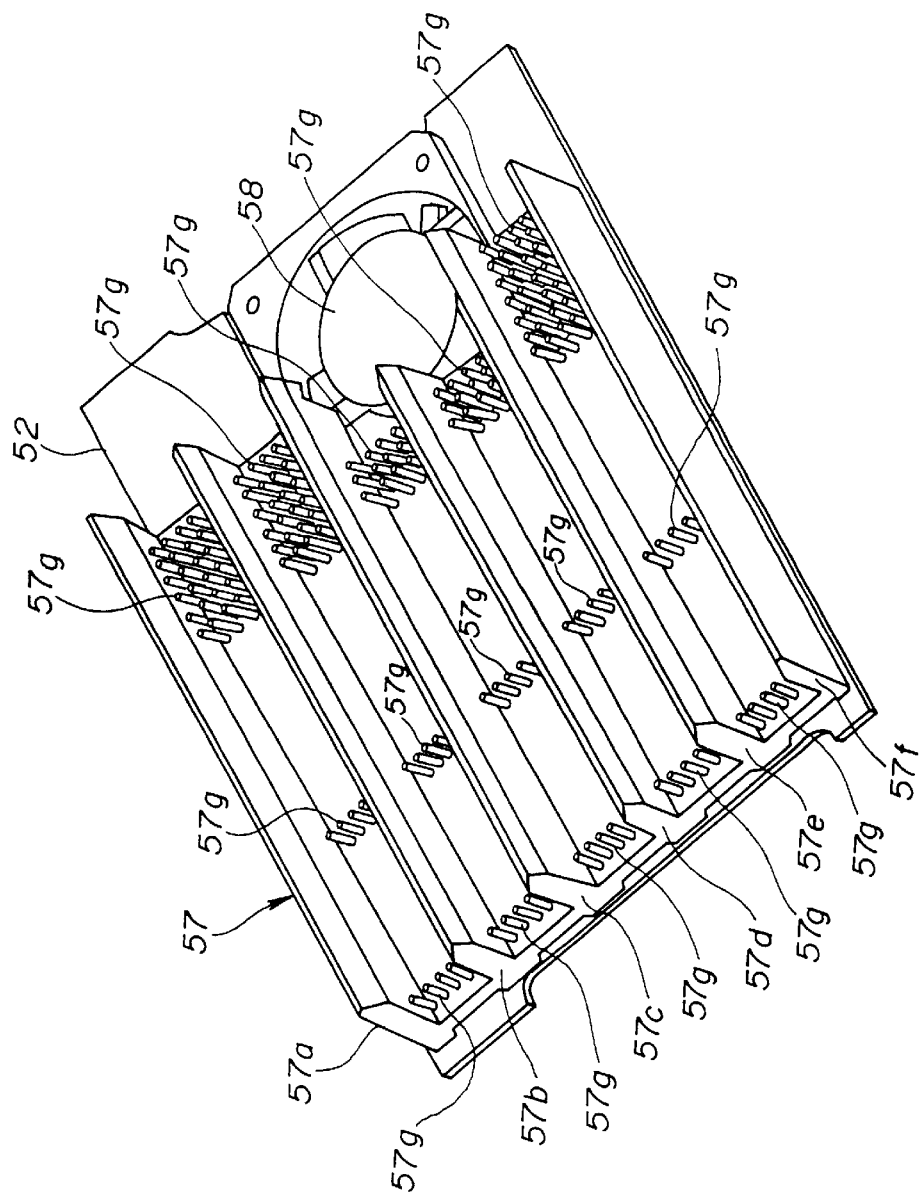
FIG. 9 is a perspective view of an electric fan attached to a front face substrate in the electronic apparatus of the present invention.
Figure 10:
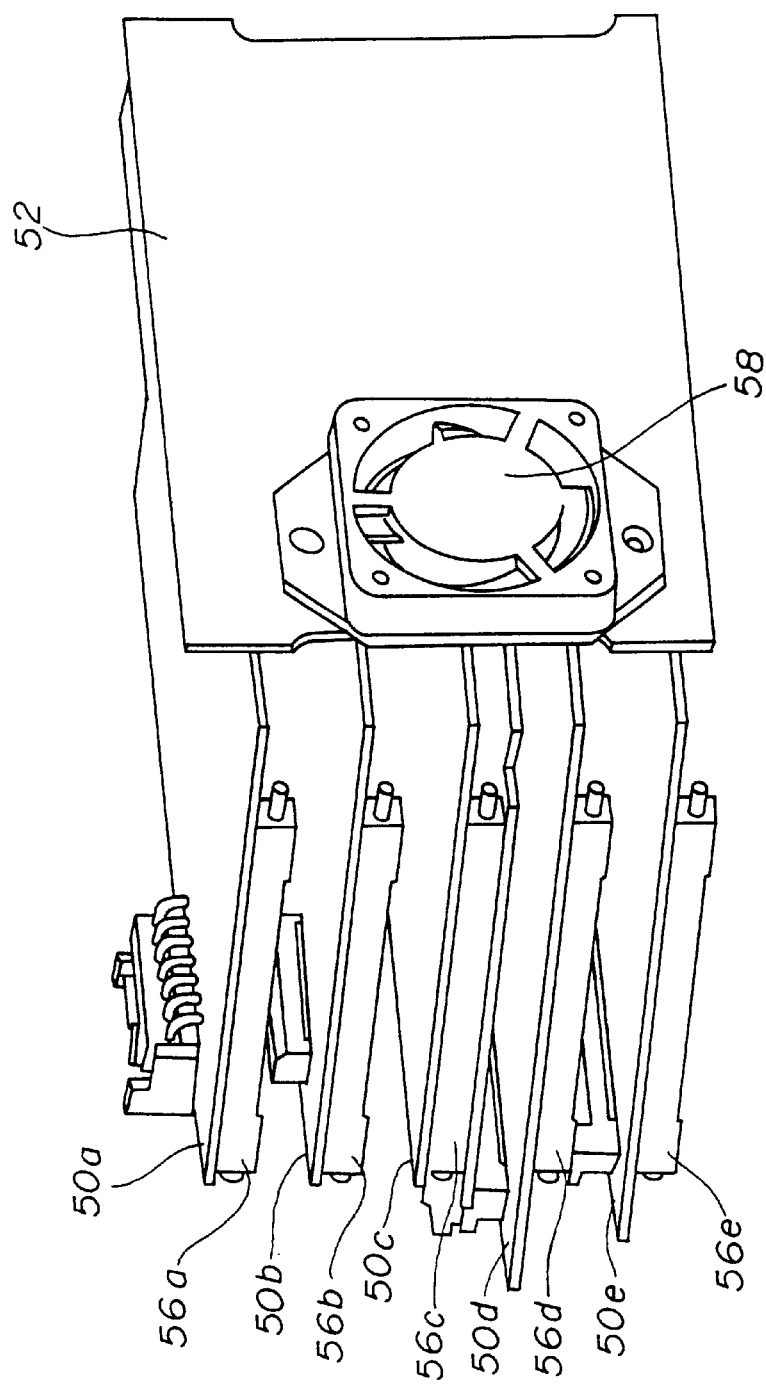
FIG. 10 is a perspective view of the electric fan attached to the front face substrate in the electronic apparatus of the present invention.

As shown in FIGS. 9 and 10, the front face substrate 52 comprises a substrate holding member 57 for holding the front ends of the circuit substrates 50a to 50e, and an electric fan 58 for cooling down the heat generating portions of the circuit substrates 50a to 50e. Substrate guides 57a to 57f protrude from the substrate holding member 57 so as to hold the front ends of the circuit substrates 50a to 50e inserted through the backside opening. A plurality of connector pins 57g for connecting with the circuit substrates 50a to 50e protrude from the gaps between the substrate guides 57a to 57f.

Seen from the above, the suction side of the electric fan 58 faces the front inner wall 42, with a predetermined gap being maintained, while the blowing side of the electric fan 58 faces the left front ends of the circuit substrates 50a to 50e, so that air current can be generated toward the gaps between the circuit substrates 50a to 50e. The air current passes through the left-side gaps between the circuit substrates 50a to 50e, and then reaches the backside face. After that, the air current passes through the power substrate 55 attached to the backside panel 21, and shifts toward the right side. The air current then moves along the right-side inner wall and returns to the front face. In this manner, the electric fan 58 generates air current in the space 37 of the hermetically sealed casing 12 so as to cool down the electric parts mounted on the circuit substrates 50a to 50e.

Also, on the front inner wall 42 of the casing 12, the plurality of inner fins 44 extend in the transverse direction, so that the air that has returned to the front face side is introduced toward the electric fan 58 by the plurality of inner fins 44. Accordingly, the electric parts mounted on the circuit substrates 50a to 50e are cooled down by the air current flowing in the casing 12, and the heat generated from the electronic parts is transmitted to the entire inner walls, including the inner fins 44, of the casing 12 by virtue of the air current. The heat of the casing 12 is then generated to the external air through the radiation fins 18 located on the front face 12a, the left and right side faces 12b and 12c, and the front face 16a of the open-close cover 16.

In the electronic apparatus 10, the temperature in the casing 12 is averaged by generating air current in the space 37 in the casing 12 without employing expensive members, such as a heat pipe, a Peltier element, and a heat exchanger. Also, the temperature of the heat generated from a CPU or the like is dispersed in the entire casing 12, and then radiated to the outside through the radiation fins 18, thereby cooling the inner temperature of the casing 12 below the allowable temperature range.

Further, as shown in FIG. 8, since the electric fan 58 is located at the left side of the front inner wall 42 of the casing 12, the left side of the casing 12 is inclined outward so that the casing 12 has a larger depth at the left side. Accordingly, the radiation fins 18 have a larger area for a larger inner fin 44, thereby achieving greater heat radiation effects. The protruding height of the radiation fins protruding from the front face 12a of the casing 12 is largest at the right end (protruding height La), and smallest at the left end (protruding height Lb).

In this manner, the front inner wall 42 protrudes outward, compared with the other portions to which the electric fan 58 does not face, and the electric fan 58 is located inside the outwardly protruding portion of the front inner surface 42.

In this structure, the volume of the inner space 27 can be increased without changing the appearance and the size of the casing 12, so as to ensure enough space for attaching the electric fan 58. In the electronic apparatus 10, the front inner wall 42 of the casing 12 facing the attachment position of the electric fan 58 is inclined in the direction of air current, and the protrusion heights of the radiation fins 18 vary with the inclination angles so that the positions of the top ends of the radiation fins 18 located outside the inclined front inner wall 42 are aligned. Accordingly, an attachment space for the electric fan 58 can be secured in the casing 12, and the electric fan 58 prevents the casing from becoming too large in outlook size.

As shown in FIGS. 6 and 7, the memory cartridge 60 is inserted into the memory cartridge holder 48 fixed in the casing 12, and pressed in the insertion direction by the open-close cover 16.

Figure 11:
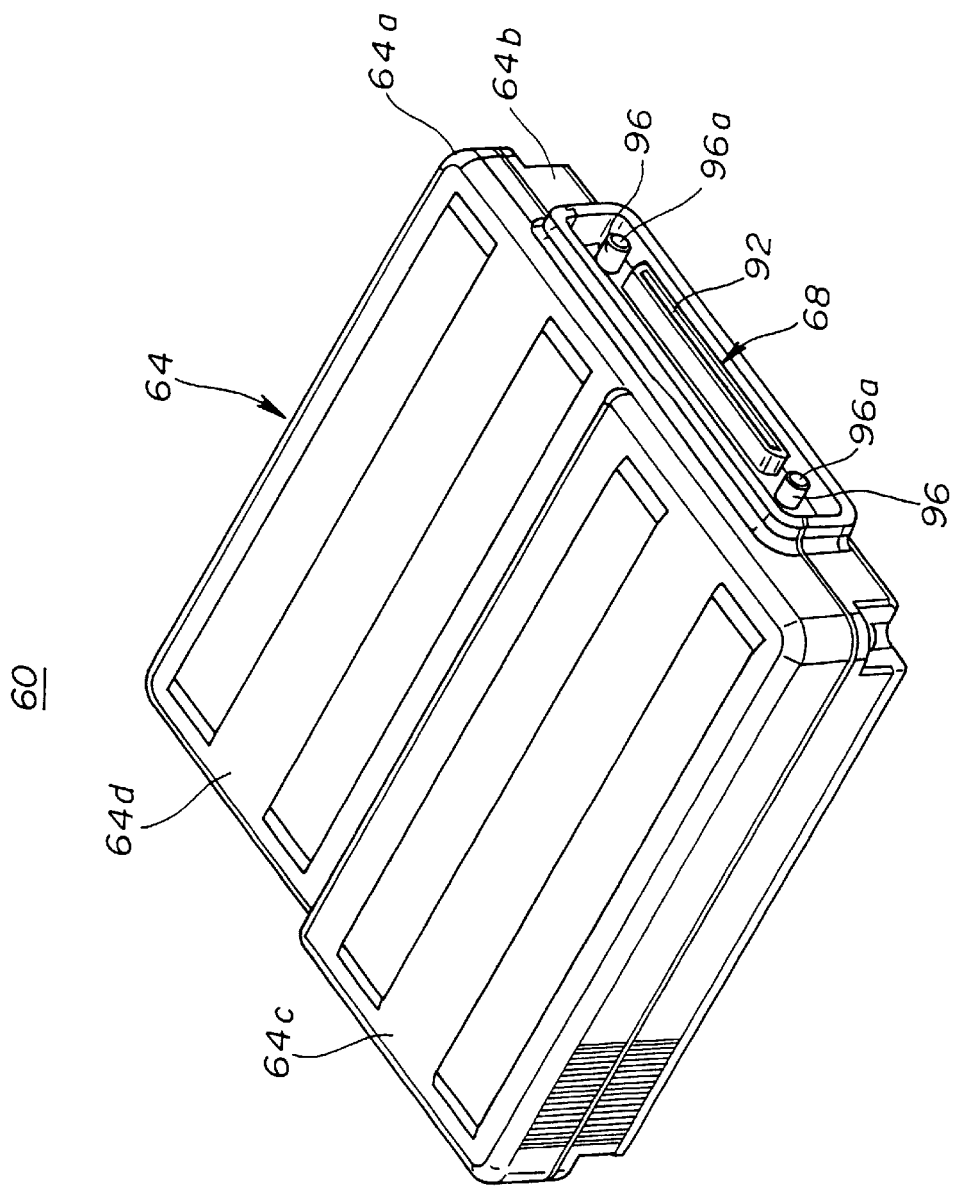
FIG. 11 is a perspective view of a memory cartridge in the electronic apparatus of the present invention.
Figure 12A:
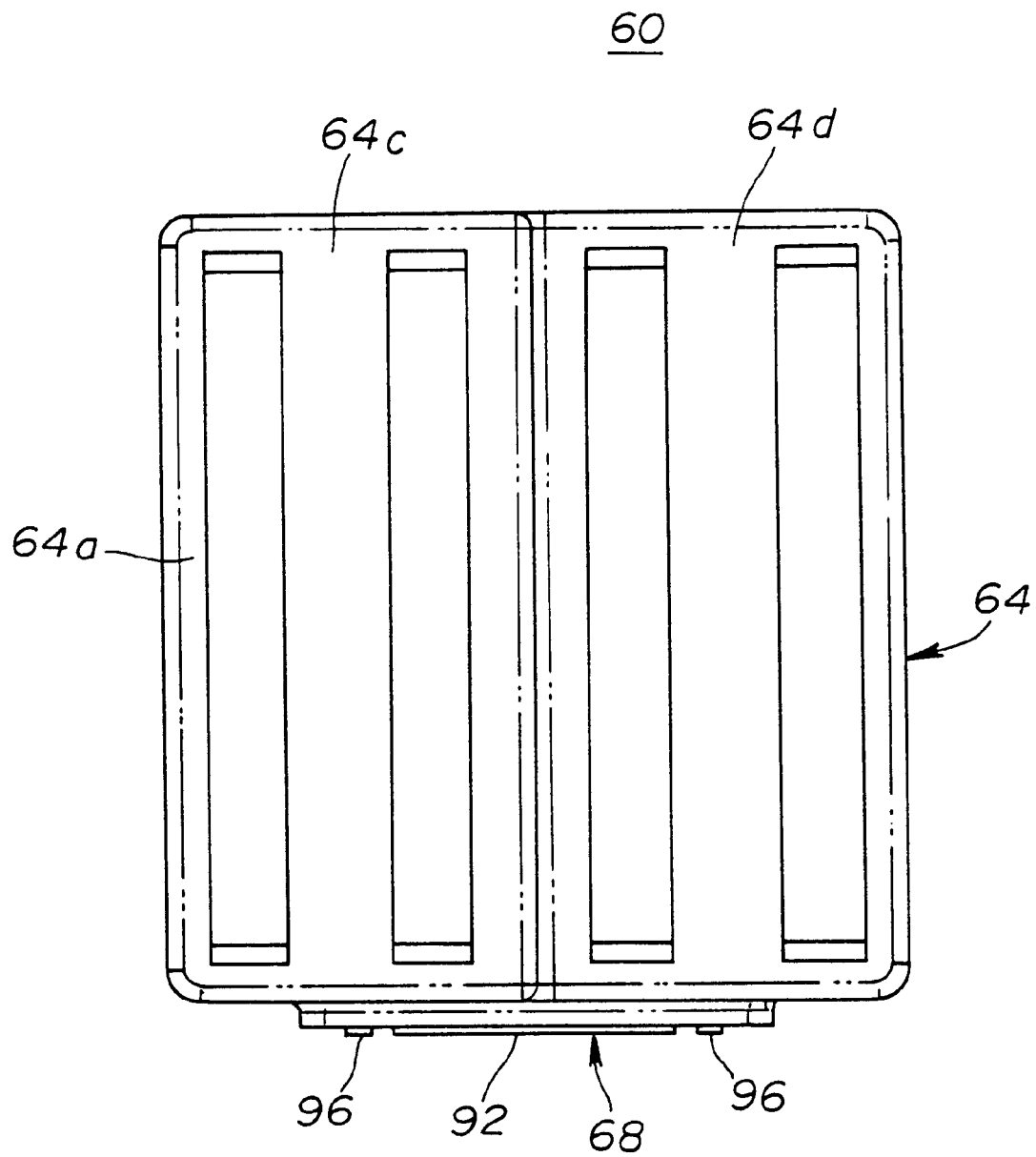
FIG. 12A is a top view of the memory cartridge.
Figure 12B:
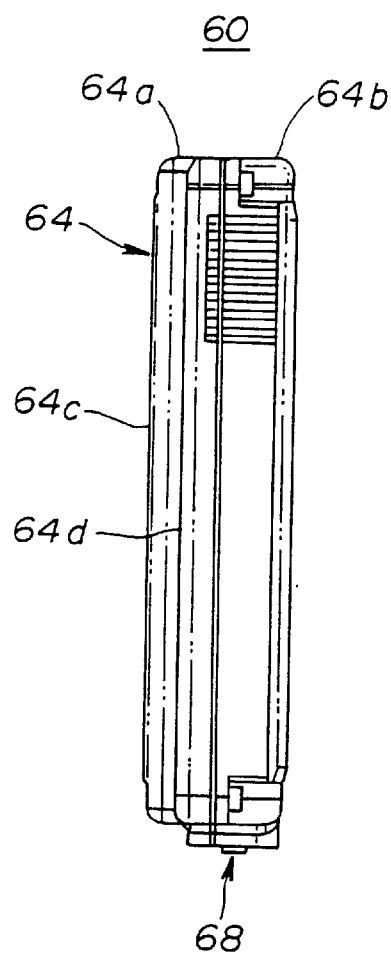
FIG. 12B is a side view of the memory cartridge.
Figure 12C:
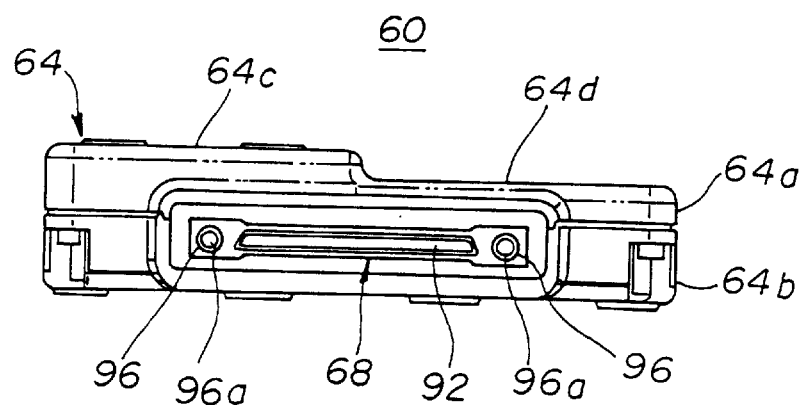
FIG. 12C is a rear view of the memory cartridge.

FIG. 11 is a perspective view showing the structure of the memory cartridge 60. FIG. 12A is a plan view, FIG. 12B is a side view, and FIG. 12C is a front view, each showing the structure of the memory cartridge 60.

As shown in FIGS. 11 and 12A to 12C, in a holder case 64 of the memory cartridge 60, a plurality (seven, in this embodiment) of memory cards 66 each containing a semiconductor memory are accommodated. Although a recording medium constituted by the memory cards 66 is employed in this embodiment, it is also possible to employ a hard disk device of a thin card type as a recording medium.

In the cartridge mounting unit 14, one memory card 67 is accommodated in the casing 12, as shown in FIG. 7. Also, the memory cartridge 60 is replaceably mounted to the cartridge mounting unit 14.

The holder case 64 is made up of an upper case 64a and a lower case 64b. The memory cartridge 60 comprises two left and right columns, and one of the columns consists of four stacked memory cards 66 while the other one consists of three stacked memory cards 66. The upper face 64c of the holder case 64 has a stepwise shape. The memory card 67 fixed in the casing 12 is located at a lower portion 64d on the upper face 64c of the memory cartridge 60.

A multipolar female connector 68 is located on the front end of the holder case 64. This multipolar female connector 68 is connected to a multipolar male connector 88 located deep inside the memory cartridge holder 48.

Figure 13:
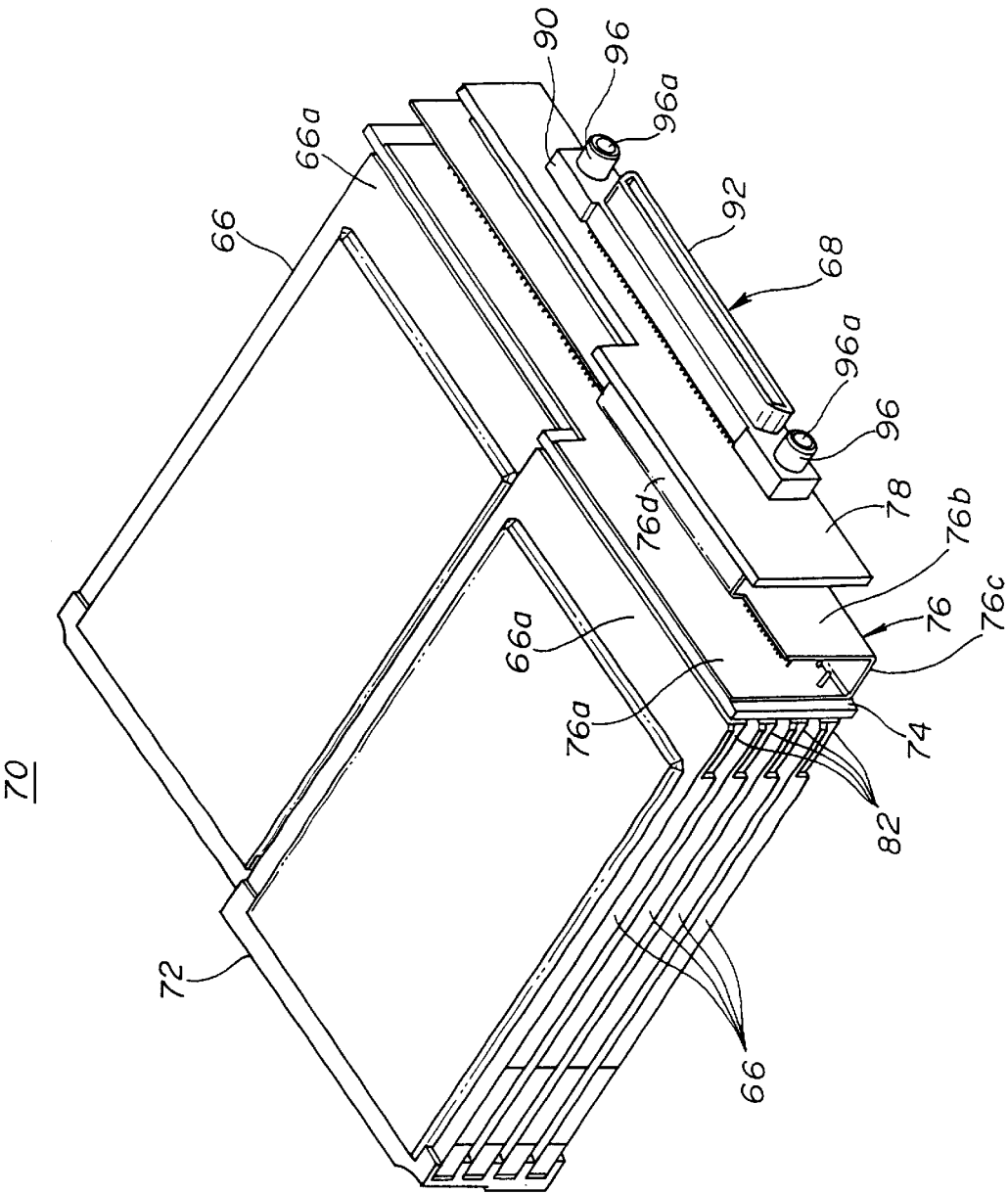
FIG. 13 is a perspective view of a memory unit accommodated in a holder case in the electronic apparatus of the present invention.

FIG. 13 is a perspective view showing a memory unit 70 to be accommodated in the holder case 64. As shown in FIG. 13, the memory unit 70 comprises a plurality of memory cards 66, a card holder 72 engaged with the back ends of the memory cards 66, a socket substrate 74 equipped with sockets 82 connected to the terminals of the memory cards 66, a flexible printed circuit board (FPC) 76 connected to each connector pin on the surface of the socket substrate 74, a movable substrate 78 that is connected to the other end of the flexible printed circuit board 76, and the multipolar female connector (first connecting terminal) 68 fixed onto the surface of the movable substrate 78.

The front end 66a of each memory card 66 is engaged with each corresponding one of the sockets 82 located on the back face of the socket substrate 74 and connected to a connector pin (not shown). The back end 66b of each memory card 66 is engaged with and held by the card holder 72. Accordingly, the memory cards 66 can be securely accommodated in the holder case 64.

Figure 14:
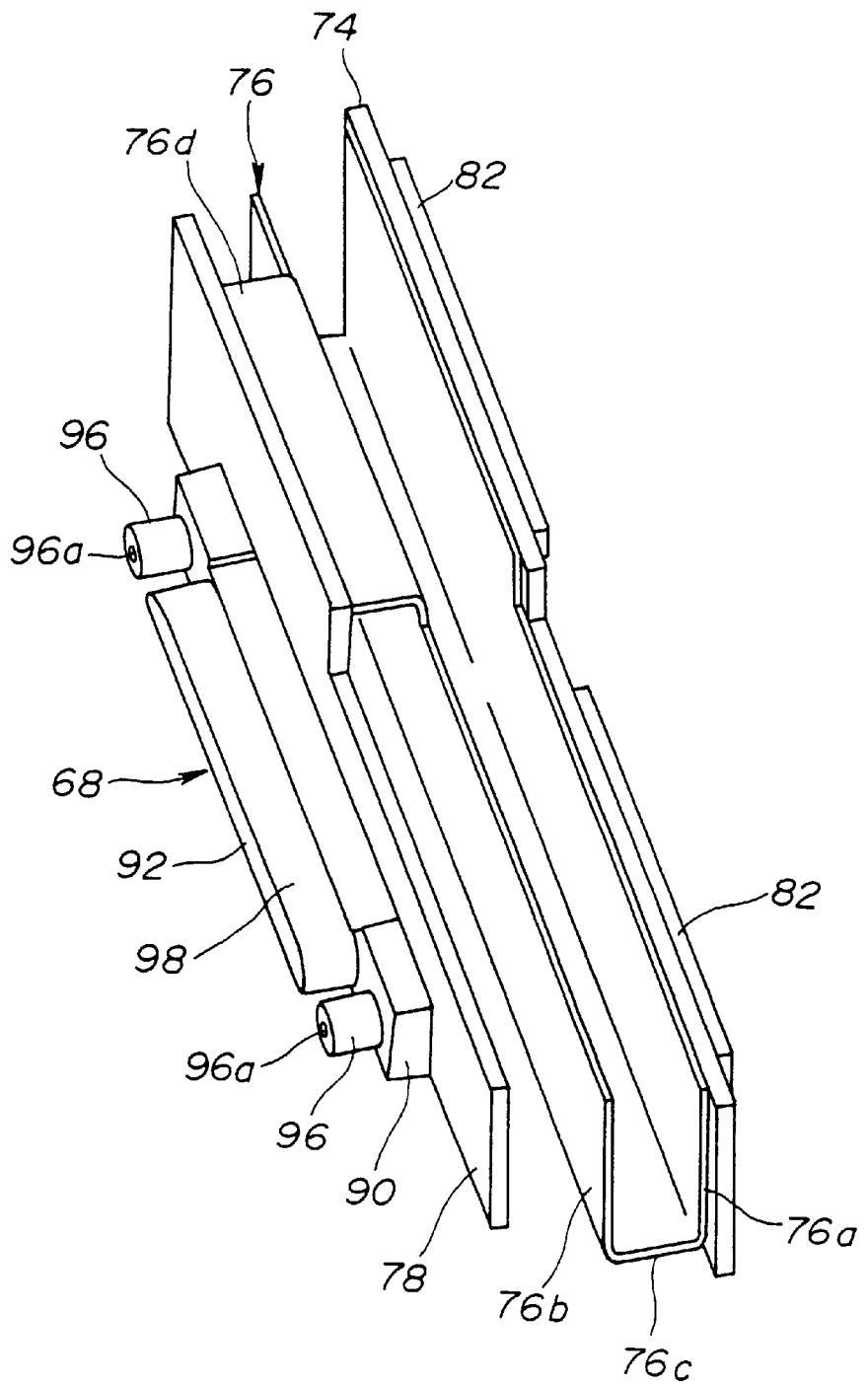
FIG. 14 is a perspective view of a connection structure of a flexible printed circuit board, a movable substrate, and a multipolar female connector.

The flexible printed circuit board 76 has a U-shape when seen from one side, as shown in FIG. 14. The flexible printed circuit board 76 comprises a first connecting unit 76a that vertically stands so as to be connected to the connector pin of the multipolar female connector 68, a second connecting unit 76b that also vertically stands so as to be connected to the connector pin of the multipolar female connector 68, a link unit 76c that links the first connecting unit 76a to the second connecting unit 76b, and a thin arm unit 76d that is connected and fixed onto the back face of the movable substrate 78. As the link unit 76c and the arm unit 76d are bent, the relative positions of the first connecting unit 76a and the second connecting unit 76b can be moved.

The inner wall of the upper case 64a of the case holder 64 is provided with a groove 84 to be slidably engaged with the upper rim of the movable substrate 78, as shown in FIG. 6. Also, the inner wall of the lower case 64b of the case holder 64 is provided with a groove 86 to be slidably engaged with the lower rim of the movable substrate 78. The grooves 84 and 86 restrict the movement of the movable substrate 78 in the cartridge insertion direction (backward and forward).

The depth of the grooves 84 and 86 is larger than the height of the movable substrate 78. Also, the groves 84 and 86 are wider than the movable substrate 78. As the movable substrate 78 is engaged with the grooves 84 and 86, the movement of the movable substrate 78 in the cartridge insertion direction is restricted, but the movable substrate 78 can be moved in the direction perpendicular to the insertion direction. Since the multipolar female connector 68 is fixed to the movable substrate 78, it is possible to position the multipolar female connector 68 relatively with the multipolar male connector (second connecting terminal) 88 located deep inside the memory cartridge holder 48 when the cartridge is inserted.

Figure 15D:
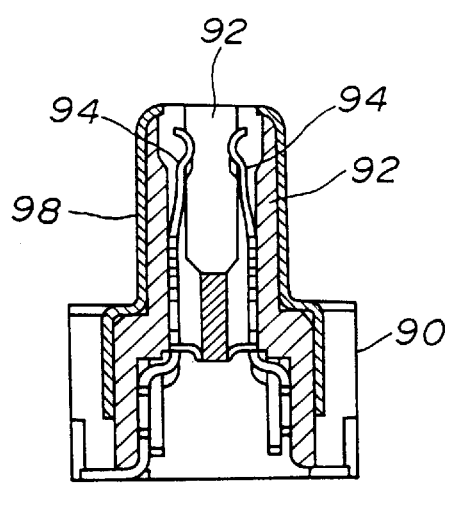
FIG. 15D is an enlarged longitudinal section of the multipolar female connector, taken along the line A—A.
Figure 15E:
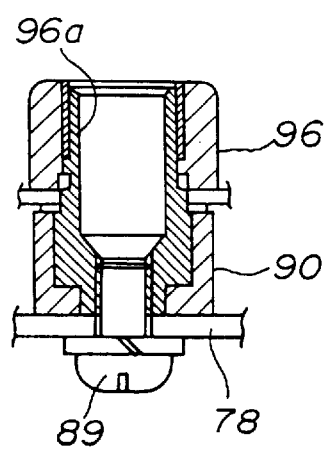
FIG. 15E is an enlarged longitudinal section of the multipolar female connector, taken along the line B—B.

FIGS. 15A to 15E show the structure of the multipolar female connector 68. More specifically, FIG. 15A is a plan view, FIG. 15B is a front view, FIG. 15C is a side view, FIG. 15D is an enlarged longitudinal section taken along the line A—A, FIG. 15E is an enlarged longitudinal section taken along the line B—B, and FIG. 15F is an enlarged longitudinal section taken along the line C—C, each of which shows the structure of the multipolar female connector 68.

As shown in FIGS. 15A to 15F, the multipolar female connector 68 comprises a base member 90 fixed to the movable substrate by tightening a machine screw 89, an inserting unit 92 into which terminals 88a of the multipolar male connector 88 are inserted, a pair of connector pins 94 located in an inner portion 92a of the inserting unit 92, and a positioning unit 96 protruding from both ends of the base member 90. The pair of connector pins 94 are electrically connected to the terminals 88a of the multipolar male connector 88, and are arranged in parallel along the direction of the inserting unit 92 in accordance with the number of terminals 88a of the multipolar male connector 88.

The positioning unit 96 is formed into a cylindrical shape, and provided with guide holes 96a for internally positioning the multipolar female connector 68. Also, a metallic cover 98 for preventing deformation is engaged with the outer portion of the card inserting unit 92.

Figure 15F:
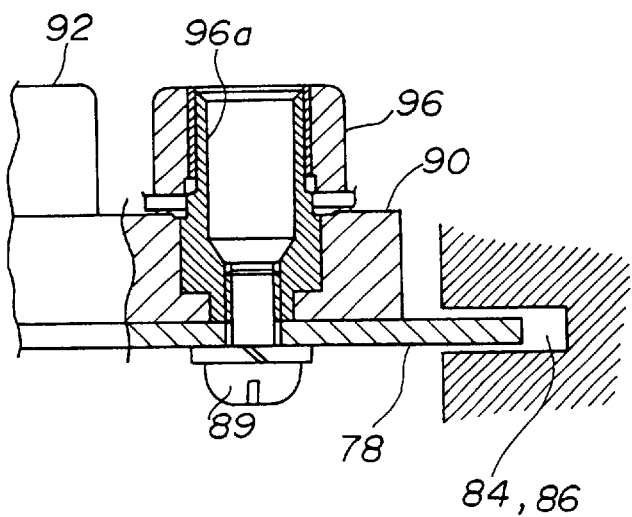
FIG. 15F is an enlarged longitudinal section of the multipolar female connector, taken along the line C—C.

Also, in the movable substrate 78 having the multipolar female connector 68, the grooves 84 and 86 formed on the inner wall of the holder case are wider than the movable substrate 78 in the transverse direction of the multipolar female connector 68, as shown in FIG. 15F. Thus, a positioning operation in the transverse direction can be performed.

Figure 16:
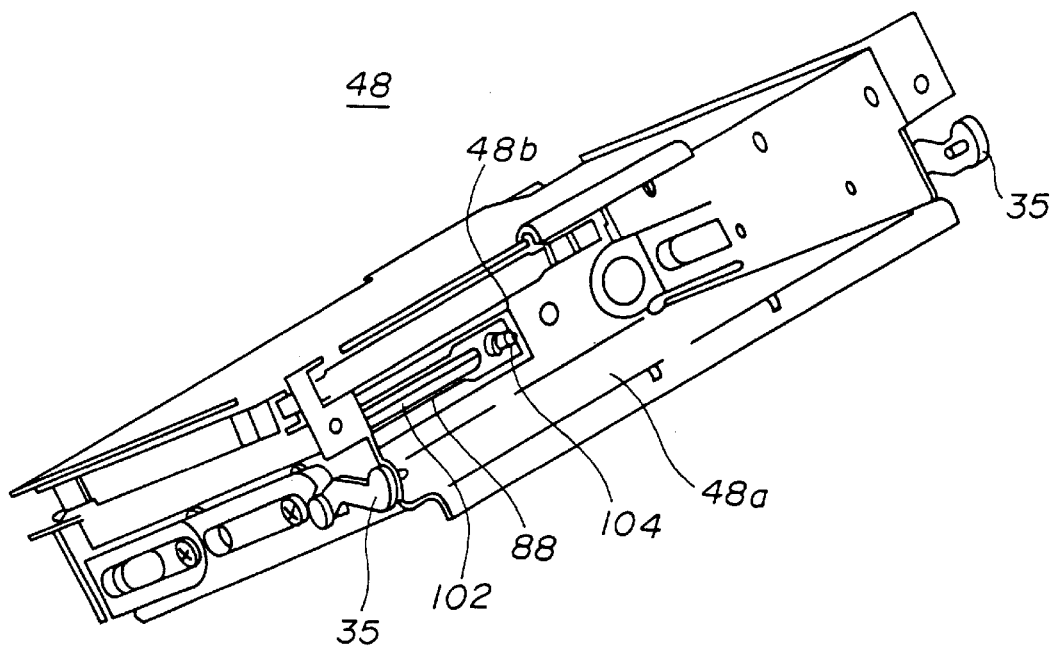
FIG. 16 is a perspective view of a memory cartridge holder in the electronic apparatus of the present invention.

FIG. 16 is a perspective view showing the structure of the memory cartridge holder 48.

As shown in FIG. 16, the memory cartridge holder 48 is a box-like member formed from a metal plate, and has an insertion inlet 48a on the front face through which the memory cartridge 60 is inserted. The multipolar male connector 88 is fixed onto a substrate 48b located on the back face of the memory cartridge holder 48, as shown in FIG. 6. As the memory cartridge 60 is inserted into the insertion inlet 48a, the multipolar female connector 68 located at the front end of the memory cartridge 60 faces the multipolar male connector 88.

When the open-close cover 16 is closed, the cartridge contact portion 28 protruding from the back face of the open-close cover 16 pushes the back end of the memory cartridge 60 in the insertion direction. As a result, the multipolar female connector 68 is engaged with the multipolar male connector 88, and the connector pins 94 are connected to the terminals 88a. The terminals 88a of the multipolar connector 88 are connected to the circuit substrate 50 via a cable 87 shown in FIG. 6.

Figure 17D:
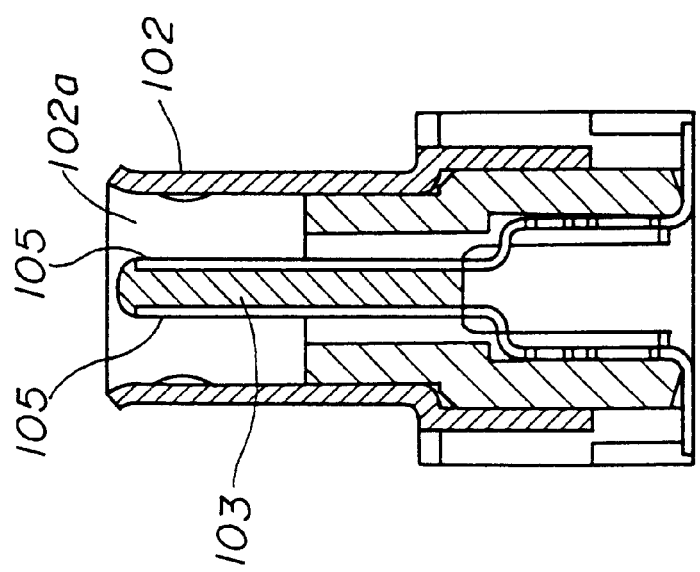
FIG. 17D is an enlarged longitudinal section of the multipolar male connector, taken along the line D—D.
Figure 17E:
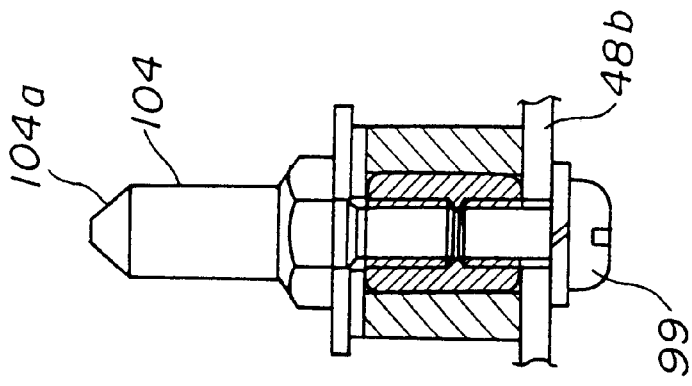
FIG. 17E is an enlarged longitudinal section of the multipolar male connector, taken along the line E—E.

FIGS. 17A to 17E show the structure of the multipolar male connector 88. More specifically, FIG. 17A is a plan view, FIG. 17B is a front view, FIG. 17C is a side view, FIG. 17D is an enlarged longitudinal section taken along the line D—D, and FIG. 17E is an enlarged longitudinal view taken along the line E—E, each of which shows the structure of the multipolar male connector 88.

As shown in FIGS. 17A to 17E, The multipolar male connector 88 comprises a base member 100 fixed onto the substrate 48b of the memory cartridge holder 48 by tightening a machine screw 99, an engagement portion 102 engaged with the outer portion of the inserting portion 92, a terminal substrate that stands from an inner portion 102a of the engagement portion 102, a pair of positioning guide pins 104 protruding from both ends of the base member 100, and multipolar terminals 105 located on the back face of the terminal substrate 103. Each of the guide pins 104 has a taper portion 104a on its top end, and faces a positioning portion 96 of the multipolar female connector 68.

When the memory cartridge 60 is inserted through the insertion inlet 48a, the guide holes 96a formed at the positioning portion 96 of the multipolar female connector 68 face the guide pins 104 of the multipolar male connector 88.

When the open-close cover 16 is closed, the cartridge contact portion 28 protruding from the back face of the open-close cover 16 pushes the back end of the memory cartridge 60, and the guide holes 96a are guided by the inclined portion of the tapered portions 104a at the top ends of the guide pins 104, so that the movable substrate 78 is moved in the positioning direction and the guide holes 96a are engaged with the guide pins 104. Accordingly, during the inserting operation of the memory cartridge 60, the positions of the guide holes 96a on the movable end are guided by the tapered portions 104a of the guide pines 104 on the fixed end, thereby adjusting the position in the direction perpendicular to the insertion direction. In this manner, the multipolar female connector 68 can be engaged without fail with the multipolar male connector 88, and the connector pins 94 are connected to the multipolar terminals 105.

In the above embodiment, the memory cartridge 60 that accommodates the memory cards 66 or a hard disk device is inserted into the memory cartridge holder 48. However, it is of course possible to apply the present invention to other structures on which a recording medium of a different type is mounted.

Also, the electronic apparatus 10 of the above embodiment is used as a recording apparatus for an airplane, but can be used for other purposes.

On the whole, the present invention is not limited to the specifically disclosed embodiments, but variations and modifications may be made without departing from the scope of the present invention.

What is claimed is:

1. An electronic apparatus comprising:
    a casing having walls forming an enclosure that accommodates circuit substrates each equipped with an electronic part in a hermetically sealed space of said casing;
    a fan that is located inside the hermetically sealed space within the casing and generates air current passing through the circuit substrates;
    an air current guide unit that is located on a wall on the inside surface of the casing and extends in the direction of guiding the air current toward a suction side of the fan; and
    a plurality of radiation fins that are located outside the casing adjacent at least one wall thereof for transmitting heat from said air current guide unit inside said casing to said radiation fins.

2. The electronic apparatus as claimed in claim 1, wherein:
    a wall surface of the casing that faces an attachment position of the fan is inclined in a direction of the air current; and
    protruding heights of the plurality of radiation fins vary with inclination angle of the wall surface, so that top ends of the plurality of radiation fins are aligned outside the inclined wall surface.

3. The electronic apparatus as claimed in claim 1, wherein a wall surface of the casing that faces the fan is located outside an area to which the fan does not face.

4. The electronic apparatus as claimed in claim 1, wherein the fan is located on an inner side of a wall surface protruding outwardly from the casing.

5. An electronic apparatus, comprising:
    a mounting unit into which a cartridge that accommodates a recording medium is replaceably inserted;
    a first connecting terminal formed on the cartridge, the first connecting terminal being a part of the mounting unit; and
    a second connecting terminal to which the first connecting terminal is electrically connected, the second connecting terminal being a part of the mounting unit,
    wherein either the first connecting terminal or the second connecting terminal is movable in a direction perpendicular to an insertion direction.

6. The electronic apparatus as claimed in claim 5, wherein:
    one of the first connecting terminal and the second connecting terminal has tapered guide pins that extend in the insertion direction; and
    the other one of the first connecting terminal and the second connecting terminal has guide holes that are engaged with the guide pins and also has positioning guide holes.

7. The electronic apparatus as claimed in claim 5, wherein:
    one of the first connecting terminal and the second connecting terminal is connected to a flexible cable; and
    a restriction unit that restricts movement in the insertion unit is located on an inner wall of the cartridge.

8. The electronic apparatus as claimed in claim 5, wherein the recording medium is constituted by a memory card that includes a semiconductor memory.

9. The electronic apparatus as claimed in claim 5, wherein the recording medium is constituted by a hard disk device.

* * * * *